(12) United States Patent
Zhao et al.

(10) Patent No.: US 9,281,323 B2
(45) Date of Patent: Mar. 8, 2016

(54) ARRAY SUBSTRATE, DISPLAY PANEL AND DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventors: Jian Zhao, Shanghai (CN); Hong Ding, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 14/285,538

(22) Filed: May 22, 2014

(65) Prior Publication Data

US 2015/0187820 A1 Jul. 2, 2015

(30) Foreign Application Priority Data

Dec. 26, 2013 (CN) .......................... 2013 1 0732436

(51) Int. Cl.
*H01L 27/12* (2006.01)
(52) U.S. Cl.
CPC .................................. *H01L 27/1244* (2013.01)
(58) Field of Classification Search
CPC combination set(s) only.
See application file for complete search history.

(56) References Cited

U.S. PATENT DOCUMENTS

| 4,853,755 A * | 8/1989 | Okabe et al. ..................... 257/72 |
| 6,445,427 B1 * | 9/2002 | Lee et al. ......................... 349/40 |
| 7,158,194 B2 * | 1/2007 | Lo et al. .......................... 349/40 |
| 7,719,624 B2 * | 5/2010 | Liao et al. ....................... 349/40 |
| 2012/0169986 A1 * | 7/2012 | Kwon et al. .................. 349/139 |

FOREIGN PATENT DOCUMENTS

KR 20010058156 A 7/2001

\* cited by examiner

*Primary Examiner* — Matthew Reames
(74) *Attorney, Agent, or Firm* — Alston & Bird LLP

(57) ABSTRACT

An array substrate is disclosed. The array substrate includes a non-display region surrounding a display region. The array substrate also includes gate lines in the display region, and a gate drive circuit and a bus electrically insulated from the gate lines and a gate drive circuit in the non-display region. The gate lines extend into the non-display region and are electrically connected to the gate drive circuit, and each of the gate lines crosses the bus in a first overlap region. The array substrate also includes auxiliary electrode line segments between the bus and the display region. The auxiliary electrode line segments are electrically insulated from one another and from the gate lines, and the auxiliary electrode line segments are disposed in either of a same conductive layer as the bus, or a layer between the conductive layer of the bus and a conductive layer of the gate lines are disposed.

14 Claims, 4 Drawing Sheets

ARRAY SUBSTRATE, DISPLAY PANEL AND DISPLAY DEVICE

CROSS REFERENCE TO RELATED APPLICATIONS

This application claims the benefit of priority to Chinese Patent Application No. 201310732436.5, filed with the Chinese Patent Office on Dec. 26, 2013 and entitled "ARRAY SUBSTRATE, DISPLAY PANEL AND DISPLAY DEVICE", the content of which is incorporated herein by reference in its entirety.

TECHNICAL FIELD

The disclosure relates to the field of electrostatic protection, and in particular to electrostatic protection for an array substrate, a display panel and a display device.

BACKGROUND OF THE INVENTION

Thin Film Transistor Liquid Crystal Display (TFT-LCD) dominates the current display device market and is widely used in electronic products such as mobile phones, televisions and computers, due to its advantages such as small size, low power consumption and no radiation.

The thin film transistor liquid crystal display device mainly includes an array substrate, a liquid crystal layer and a color filter substrate. The liquid crystal layer is formed between the array substrate and the color filter substrate. The major axes of liquid crystal molecules in the liquid crystal layer are controlled to rotate by applying voltages respectively on the array substrate and the color filter substrate, to control the amount of light transmitted through the liquid crystal layer, and thus the intensity of the light transmitted through the liquid crystal layer is adjusted.

Referring to FIG. 1, a schematic structural diagram of an existing array substrate is shown. The array substrate includes a non-display region 100 and a display region 200, with the non-display region 100 surrounding the display region 200. There are multiple gate lines 201 in the display region 200. The gate line 201 extends to the non-display region 100 and is electrically connected to a gate drive circuit 102 in the non-display region 100. A bus 101 is disposed on a margin area of the non-display region 100 which is close to the display region 200. The gate lines 201 and the bus 101 cross each other and are electrically insulated from each other in the overlap region.

Generally, functional layers are formed on a large glass substrate, and then the large glass substrate is cut into multiple array substrates. However, there are many problems in the manufacture process of the existing array substrate, which results in a low yield.

BRIEF SUMMARY OF THE INVENTION

One inventive aspect is an array substrate. The array substrate includes a display region, and a non-display region, where the non-display region surrounds the display region. The array substrate also includes a plurality of gate lines in the display region, a bus in the non-display region, a gate drive circuit in the non-display region, and a bus electrically insulated from the gate lines. The gate lines extend into the non-display region and are electrically connected to the gate drive circuit, and each of the gate lines crosses the bus in a first overlap region. The array substrate also includes a plurality of auxiliary electrode line segments between the bus and the display region, where the auxiliary electrode line segments are electrically insulated from one another and from the gate lines, and where the auxiliary electrode line segments are disposed in either of a same conductive layer as the bus, or a layer between the conductive layer of the bus and a conductive layer of the gate lines are disposed. In addition, each of the gate lines crosses one of the auxiliary electrode line segments in a second overlap region.

Another inventive aspect is a display panel including an array substrate. The array substrate includes a display region, and a non-display region, where the non-display region surrounds the display region. The array substrate also includes a plurality of gate lines in the display region, a bus in the non-display region, a gate drive circuit in the non-display region, and a bus electrically insulated from the gate lines. The gate lines extend into the non-display region and are electrically connected to the gate drive circuit, and each of the gate lines crosses the bus in a first overlap region. The array substrate also includes a plurality of auxiliary electrode line segments between the bus and the display region, where the auxiliary electrode line segments are electrically insulated from one another and from the gate lines, and where the auxiliary electrode line segments are disposed in either of a same conductive layer as the bus, or a layer between the conductive layer of the bus and a conductive layer of the gate lines are disposed. In addition, each of the gate lines crosses one of the auxiliary electrode line segments in a second overlap region.

Another inventive aspect is a display device including a display panel, the display panel including an array substrate. The array substrate includes a display region, and a non-display region, where the non-display region surrounds the display region. The array substrate also includes a plurality of gate lines in the display region, a bus in the non-display region, a gate drive circuit in the non-display region, and a bus electrically insulated from the gate lines. The gate lines extend into the non-display region and are electrically connected to the gate drive circuit, and each of the gate lines crosses the bus in a first overlap region. The array substrate also includes a plurality of auxiliary electrode line segments between the bus and the display region, where the auxiliary electrode line segmentss are electrically insulated from one another and from the gate lines, and where the auxiliary electrode line segments are disposed in either of a same conductive layer as the bus, or a layer between the conductive layer of the bus and a conductive layer of the gate lines are disposed. In addition, each of the gate lines crosses one of the auxiliary electrode line segments in a second overlap region.

BRIEF DESCRIPTION OF THE DRAWINGS

The accompanying drawings needed to be used in the description of the embodiments or the prior art will be described briefly as follows, so that the technical solutions according to the embodiments of the disclosure or according to the prior art will become clearer. It is obvious that the accompanying drawings in the following description are only some embodiments of the disclosure. For those skilled in the art, other accompanying drawings may be obtained according to these accompanying drawings without any creative work.

DETAILED DESCRIPTION OF THE PREFERRED EMBODIMENTS

Figure 1:
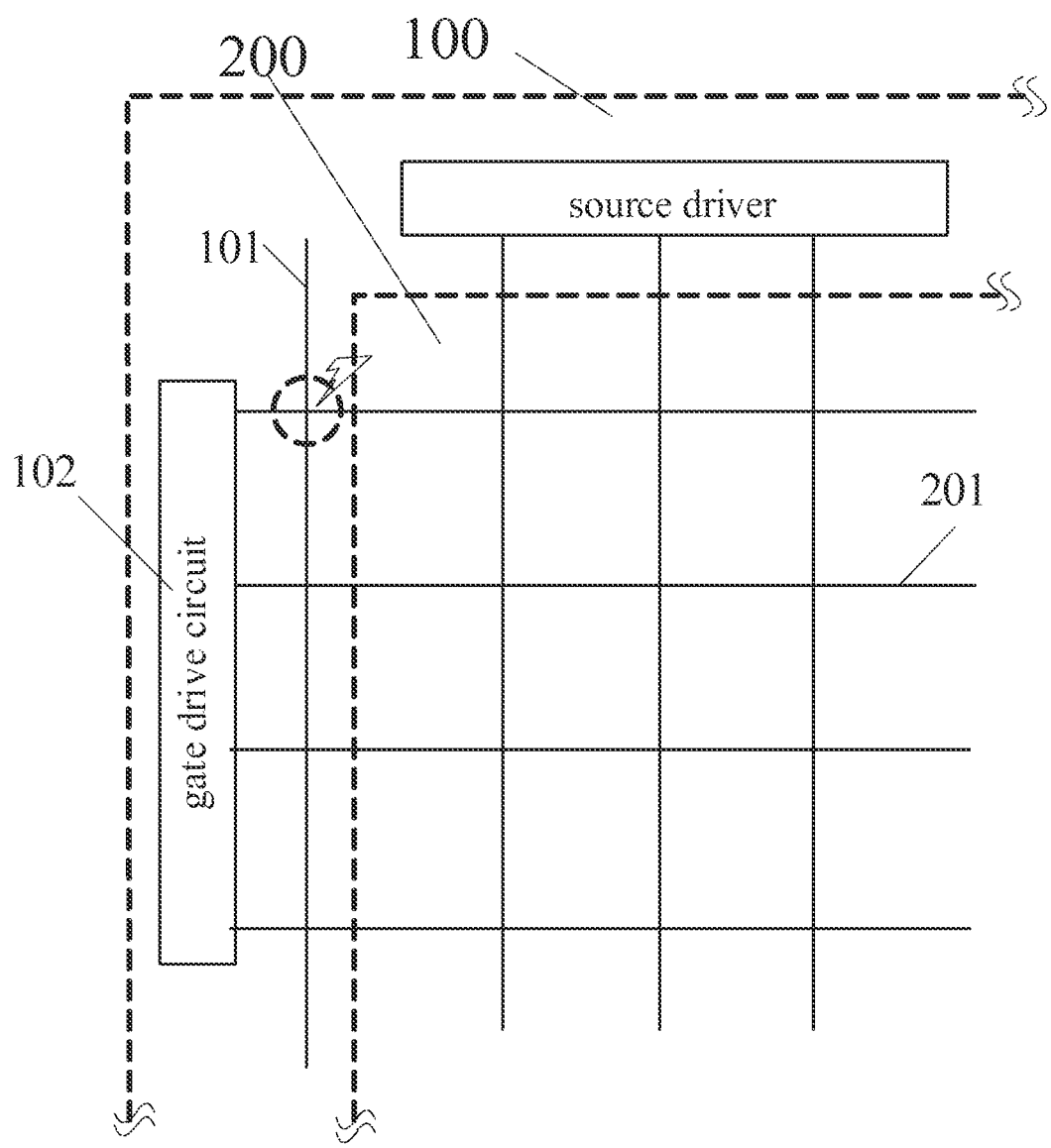
FIG. 1 is a schematic structural diagram of an existing array substrate.

As described in the background, the manufacture of an existing array substrate has a low yield. The inventor has found after research that the main cause of such defect lies in that the electrostatic breakdown occurs between the gate lines and the bus in the overlap region, leading to short circuit between the gate lines and the bus.

Specifically, during the manufacture of the array substrate, there is always an overlap region between the gate line and bus when manufactured. However, static electricity is accumulated on the gate line and the bus during the manufacture of the array substrate. Once the static electricity is accumulated to a certain extent, the electrostatic breakdown may occur in the overlap region of the gate line and the bus, thereby destroying the structure of the overlap region and leading to electrical conduction between the bus and the gate line. The electrostatic breakdown is especially prone to occur between the gate line and the bus disposed in a margin area of the non-display region which is close to the display region. Therefore, the product yield of the array substrate is reduced.

In order to overcome the above conventional problem, an embodiment of the disclosure provides an array substrate, including a display region and a non-display region, with the non-display region surrounding the display region. Multiple gate lines are in the display region and a bus is in the non-display region. The gate lines extend to the non-display region and are electrically connected to a gate drive circuit in the non-display region. Each of the gate lines and the bus cross each other at a first overlap region and are electrically insulated in the first overlap region. The array substrate further includes:

multiple auxiliary electrode line segments disposed between the bus and the display region, where the auxiliary electrode line segments are disposed in a same conductive layer as the bus or are disposed in a layer between a conductive layer where the bus is disposed and a conductive layer where the gate lines are disposed, the multiple auxiliary electrode line segments are electrically insulated from each other, each of the gate lines crosses one of the auxiliary electrode line segments at a second overlap region, where the gate line and the auxiliary electrode line segment are electrically insulated from each other.

According to the above solution, because of the auxiliary electrode line segments, the electrostatic discharge occurs between the gate lines and the corresponding auxiliary electrode line segments during the manufacture of the array substrate, to release the static electricity on the gate lines, thereby reducing to a great extent the probability of short circuit due to the electrostatic discharge between the gate lines and the bus and improving the product yield.

The core conception of the disclosure is disclosed above. Detailed description of the embodiments of the disclosure is made below in conjunction with the accompanying drawings to make the above objectives, features and advantages of the disclosure more apparent.

More specific details are set forth in the following descriptions for sufficient understanding of the disclosure. However the disclosure may be implemented by other ways different from the way described herein, similar extensions may be made by those skilled in the art without departing from the spirit of the disclosure. Therefore, the disclosure is not limited to particular embodiments disclosed hereinafter.

In addition, the disclosure is described in conjunction with the schematic drawings. In describing the embodiments of the disclosure in detail, for ease of illustration, sectional views showing the structure of the device are enlarged partially without usual scale, and the views are only examples, which should not be understood as limiting the scope of protection of the disclosure. Furthermore, in an actual manufacture process, three-dimensioned space sizes, i.e., length, width and depth should be considered.

Figure 2A:
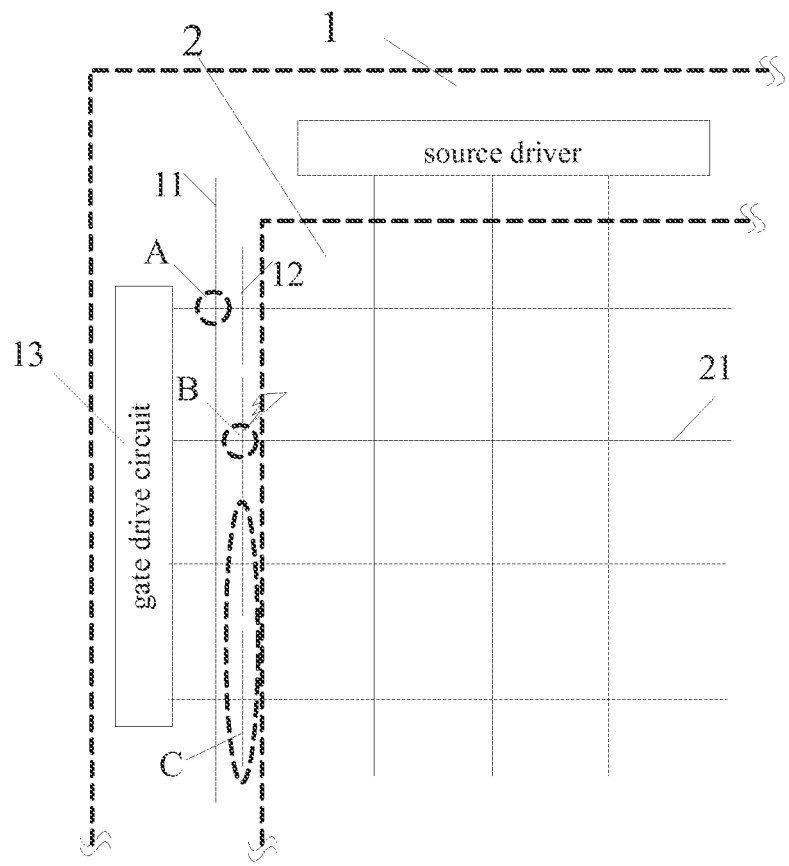
FIG. 2a is a schematic structural diagram of an array substrate according to an embodiment of the application.

An embodiment of the application provides an array substrate. Referring to FIG. 2a, the schematic structural diagram of the array substrate according to the embodiment of the application is shown. The array substrate includes:

a non-display region 1 and a display region 2, with the non-display region 1 surrounding the display region 2;

a bus 11 in the non-display region 1;

multiple gate lines 21 in the display region 2.

The gate lines 21 extend to the non-display region 1 and are electrically connected to a gate drive circuit 13 in the non-display region 1. Each of the gate lines 21 and the bus 11 cross each other at a first overlap region A and are electrically insulated in the first overlap region A. The array substrate further includes multiple auxiliary electrode line segments 12 in the non-display region 1. Preferably, the auxiliary electrode line segments 12 may be disposed between the display region 2 and the bus 11 in the non-display region 1. The auxiliary electrode line segments 12 may be disposed in a same conductive layer as the bus 11. Alternatively, the auxiliary electrode line segments 12 may be disposed in a layer between a conductive layer where the bus 11 is disposed and a conductive layer where the gate lines 21 are disposed. Furthermore, preferably, the direction in which the auxiliary electrode line segments 12 extend is same as the direction in which the bus 11 extends, and the auxiliary electrode line segments 12 and the bus 11 are electrically insulated from each other. The multiple auxiliary electrode line segments 12 are electrically insulated from each other. Each of the gate lines 21 crosses one of the auxiliary electrode line segments 12 at a second overlap region B. The gate line 21 and the corresponding auxiliary electrode line segment 12 are electrically insulated from each other in each second overlap region B.

Figure 2B:
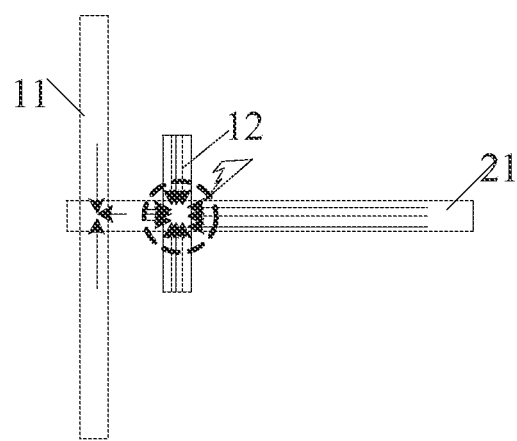
FIG. 2b is a schematic diagram showing accumulation and release of static electricity according to an embodiment of the application.

Each of the auxiliary electrode line segments provided on the above array substrate is to cause electrostatic discharge between itself and the corresponding gate line, that is, each of the auxiliary electrode line segments is provided to release the static electricity on the corresponding gate line. Referring to FIG. 2b, a schematic diagram showing accumulation and release of the static electricity is shown. The amount of the arrows indicates the amount of the static electricity. More arrows indicate larger amount of the static electricity. During the manufacture of the array substrate, the static electricity on the bus 11 has different electrical property from that of the static electricity on the gate line 12. In addition, the static electricity on the auxiliary electrode line segments 12 has a same electrical property as that of the static electricity on the bus 11, because the multiple auxiliary electrode line segments 12 are disposed very close to the bus 11. Therefore, once the static electricity is accumulated to a certain extent, the static electricity on the gate line 21, the bus 11 and the auxiliary electrode line segments 12 accumulates in the respective overlap region, eventually leading to a release of the static electricity. However, during the accumulation period, the electrostatic discharge is more prone to occur between one gate line 21 and the corresponding auxiliary electrode line segment 12, because the auxiliary electrode line segment 12 is disposed between the bus 11 and a source of the flow of the accumulated static electricity on the gate line 21, and the gate line segment between the bus 11 and the corresponding auxiliary electrode line segment 12 is very short. Therefore, the static electricity on the gate line 21 is released, and the electrostatic discharge between the gate line and the bus is avoided.

In view of the above, the electrostatic discharge between the gate line and the bus during the manufacture of the array substrate may be avoided if the static electricity on the gate line is released rapidly in a large amount between the gate line and the corresponding auxiliary electrode line segment. Therefore, the probability of the electrostatic discharge between the auxiliary electrode line segment and the gate line is expected to be increased as much as possible. The more static electricity accumulated on the auxiliary electrode line segment, the greater probability of the electrostatic discharge between the auxiliary electrode line segment and the gate line. Therefore, in a case where the design arrangement of the array substrate remains unchanged, for the auxiliary electrode line segment itself, the amount of the static electricity accumulated on one auxiliary electrode line segment may be increased by, for example, increasing the thickness of the auxiliary electrode line segment or enlarging the area of the auxiliary electrode line segment during the manufacture of the auxiliary electrode line segment, thereby increasing the probability of the electrostatic discharge between the auxiliary electrode line segment and the gate line, thus protecting the bus from electrostatic discharge.

For example, in a case where the area of one auxiliary electrode line segment is enlarged, the process for manufacturing the auxiliary electrode line segment may be optimized. Firstly, a whole auxiliary electrode line can be formed. When a passivation layer on the array substrate is manufactured, at least a via hole is formed by etching to expose a surface of at least one portion of the whole auxiliary electrode line. The auxiliary electrode line is disconnected by etching the at least one exposed portion, to form multiple auxiliary electrode line segments. Compared with multiple auxiliary electrode line segments formed separately, the area of the whole auxiliary electrode line is much larger. Therefore, in the manufacturing process, the electrostatic discharge is more prone to occur between the gate line and the auxiliary electrode line to release the static electricity. In addition, the whole auxiliary electrode line is etched into the multiple auxiliary electrode line segments, thereby avoiding the electrostatic discharge between the multiple gate lines and the whole auxiliary electrode line which may otherwise lead to short circuit between the multiple gate lines.

In addition, the area of the overlap region between one gate line and one corresponding auxiliary electrode line segment may be increased by widening the width of the gate line in the overlap region, to increase the probability of the electrostatic discharge between the gate line and the auxiliary electrode line segment.

It should be noted that, the above design for increasing the probability of the electrostatic discharge between the gate line and the auxiliary electrode line segment is not limited thereto and may be determined as required.

In the above array substrate, the auxiliary electrode line segments may be disposed in a same conductive layer as the bus or may be disposed in a layer between a conductive layer where the bus is disposed and a conductive layer where the gate lines are disposed. These two cases should be chosen as required.

In consideration of factors such as the manufacture steps and manufacture processes of the array substrate, the auxiliary electrode line segments can be formed in a conductive layer where the bus is disposed. Since the auxiliary electrode line segments are disposed in the same conductive layer as the bus, only the mask for manufacturing the conductive layer where the bus is disposed needs to be changed during the manufacture of the array substrate. Therefore, the manufacture process is simple, and no new manufacture step is added.

In a case where the auxiliary electrode line segments are disposed in a layer between the conductive layer where the bus is disposed and the conductive layer where the gate lines are disposed, a new conductive layer may need to be formed. However, the limitation to the manufacture of the auxiliary electrode line segments is little, with possibility of different thickness and different area. It should be noted that the regions covered by the auxiliary electrode line segments should not overlap the region covered by the bus preferably in the direction perpendicular to the array substrate, to avoid that both one gate line and the bus have the electrostatic discharge with one auxiliary electrode line segment which leads to short circuit between the gate line and the bus.

In a preferable embodiment of the application, the auxiliary electrode line segments are disposed in a same conductive layer as the bus. During the manufacture of the auxiliary electrode line segments, a whole auxiliary electrode line is formed firstly. After a passivation layer of the array substrate is formed, at least one via hole is formed by etching in the region where the whole auxiliary electrode line is disposed to expose at least one portion of the whole auxiliary electrode line, and the auxiliary electrode line is disconnected by etching the exposed portion of the whole auxiliary electrode line, to form multiple auxiliary electrode line segments.

Structure of Film layers in the region where the auxiliary electrode line segments are disposed in the array substrate according to the embodiments of the application is described below in detail with reference to FIGS. 3a to 4b.

Figure 3A:
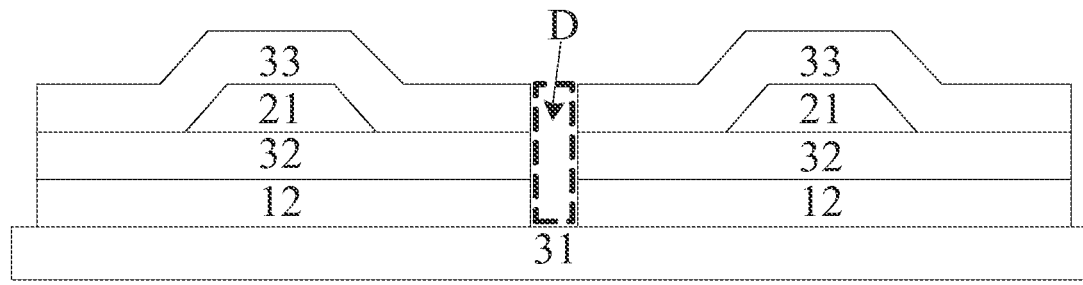
FIG. 3a is a schematic structural diagram of a region where two adjacent auxiliary electrode line segments are disposed according to an embodiment of the application.

Reference is made to FIG. 3a which shows a schematic structural diagram of a region where two adjacent auxiliary electrode line segments are disposed according to an embodiment of the application, i.e., a sectional view of Region C in FIG. 2a taken along the direction in which the auxiliary electrode line segments extended.

Referring to FIG. 3a, in the region where the auxiliary electrode line segments are disposed, the array substrate sequentially includes along the direction of light transmission:

a transparent substrate 31, where the transparent substrate 31 may be a glass substrate or a resin substrate;

the auxiliary electrode line segment 12 disposed on a surface of the transparent substrate 31;

a gate insulating layer 32 covering the auxiliary electrode line segments 12;

the gate lines 21 disposed on a surface of the gate insulating layer 32; and a passivation layer 33 covering a surface of the gate lines 21.

Figure 3B:
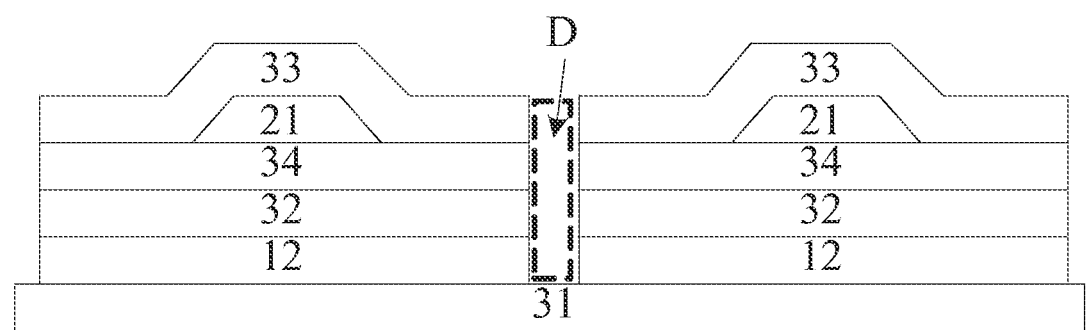
FIG. 3b is a schematic structural diagram of a region where two adjacent auxiliary electrode line segments are disposed according to an embodiment of the application.

In addition, reference is made to FIG. 3b which shows a schematic structural diagram of a region where two adjacent auxiliary electrode line segments are disposed according to an embodiment of the application, i.e. a sectional view of Region C in FIG. 2a taken along the direction in which the auxiliary electrode line segments extended. The structure in FIG. 3b is similar to the structure in FIG. 3a, except that the structure in FIG. 3b further includes an amorphous silicon layer 34 between the gate insulating layer 32 and the gate lines 21, where in the direction of light transmission, the amorphous silicon layer 34 is on a surface of the gate insulating layer 32 and the gate lines 21 are on a surface of the amorphous silicon layer 34.

Since the auxiliary electrode line segments 12 according to the embodiments of the application are formed by etching the whole auxiliary electrode line to disconnect the auxiliary electrode line after the passivation layer of the array substrate is formed, there is a via hole D between the two adjacent second overlap regions in FIGS. 3a and 3b. The via hole D separates the two auxiliary electrode line segments 12 to avoid the electrical connection between the two auxiliary electrode line segments 12.

In the two kinds of structure of the array substrates in FIGS. 3a and 3b, there may be a single layer, the gate insulating layer, between the auxiliary electrode line segments and the gate lines, or there may be a two-layer structure including the gate insulating layer and the amorphous silicon layer between the auxiliary electrode line segments and the gate lines. The smaller the total thickness of other film layer(s) between the gate lines and the auxiliary electrode line segments is, the more the probability of the electrostatic breakdown between the gate lines and the auxiliary electrode line segments is, the less the difficulty in electrostatic breakdown between the gate lines and the auxiliary electrode line segments is, and the more the possibility to avoid the electrostatic discharge between the bus and the gate lines is. Therefore, it is preferable that there is only a single layer structure of the gate insulating layer between the auxiliary electrode line segments and the gate lines.

Figure 4A:
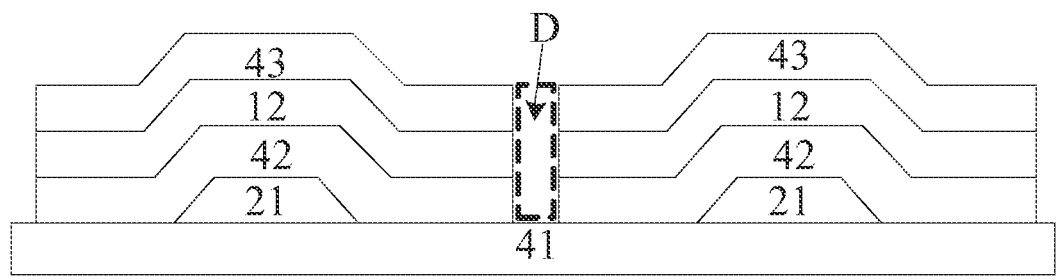
FIG. 4a is a schematic structural diagram of a region where two adjacent auxiliary electrode line segments are disposed according to an embodiment of the application.

Reference is made to FIG. 4a which shows a schematic structural diagram of a region where two adjacent auxiliary electrode line segments are disposed according to an embodiment of the application, i.e., a sectional view of Region C in FIG. 2a taken along the direction in which the auxiliary electrode line segments extended. In the region where the auxiliary electrode line segments are disposed, the array substrate sequentially includes along the direction of light transmission:

a transparent substrate 41, where the transparent substrate 41 may be a glass substrate or a resin substrate;

the gate lines 21 disposed on a surface of the transparent substrate 41;

a gate insulating layer 42 covering a surface of the gate lines 21;

the auxiliary electrode line segments 12 disposed on a surface of the gate insulating layer 42; and a passivation layer 43 covering a surface of the auxiliary electrode line segments 12.

Figure 4B:
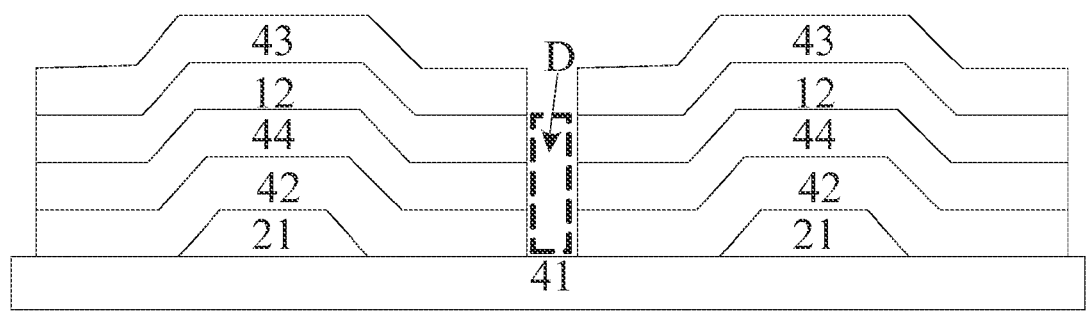
FIG. 4b is a schematic structural diagram of a region where two adjacent auxiliary electrode line segments are disposed according to an embodiment of the application.

Optionally, reference is made to FIG. 4b which shows a schematic structural diagram of a region where two adjacent auxiliary electrode line segments are disposed according to an embodiment of the application. The structure in FIG. 4b is similar to the structure in FIG. 4a, except that the structure in FIG. 4b further includes an amorphous silicon layer 44 between the gate insulating layer 42 and the auxiliary electrode line segments 12, where in the direction of light transmission, the amorphous silicon layer 44 is on a surface of the gate insulating layer 42 and the auxiliary electrode line segments 12 are disposed on a surface of the amorphous silicon layer 44.

Since the auxiliary electrode line segments 12 according to the embodiments of the application are formed by etching the whole auxiliary electrode line to disconnect the auxiliary electrode line after the passivation layer of the array substrate is formed, there is a via hole D between the two adjacent second overlap regions in FIGS. 4a and 4b. The via hole D separates the two auxiliary electrode line segments 12 to avoid the electrical connection between the two auxiliary electrode line segments 12.

In the two kind of structures of the array substrates in the FIGS. 4a and 4b, there can be a signal layer structure of the gate insulating layer between the auxiliary electrode line segments and the gate lines, or there can be a two-layer structure including the gate insulating layer and the amorphous silicon layer between the auxiliary electrode line segments and the gate lines. The smaller the total thickness of other film layer(s) between the gate lines and the auxiliary electrode line segments is, the more the probability of the electrostatic breakdown between the gate lines and the auxiliary electrode line segments is, the less the difficulty in the electrostatic breakdown between the gate lines and the auxiliary electrode line segments is, and the more the possibility to avoid the electrostatic discharge between the bus and the gate lines is. Therefore, it is preferable that there is only a single layer structure of the gate insulating layer between the auxiliary electrode line segment and the gate line.

The type of the gate drive circuit is not limited in the embodiments of the application. Preferably, the gate drive circuit may include a shift register gate drive circuit.

According to the accumulation of the static electricity during the manufacture of the array substrate, the electrostatic discharge is quite prone to occur in the first overlap region between the gate lines and the bus disposed in a margin area of the non-display region which is close to the display region. Therefore, in a preferable embodiment of the application, the bus may be disposed in a margin area of the non-display region which is close to the display region.

In a preferable embodiment of the application, the material of the auxiliary electrode line segments may be aluminum, molybdenum, molybdenum-aluminum-molybdenum, indium tin oxide, indium zinc oxide, aluminum-neodymium alloy, molybdenum-neodymium alloy, and so on.

Figure 5:
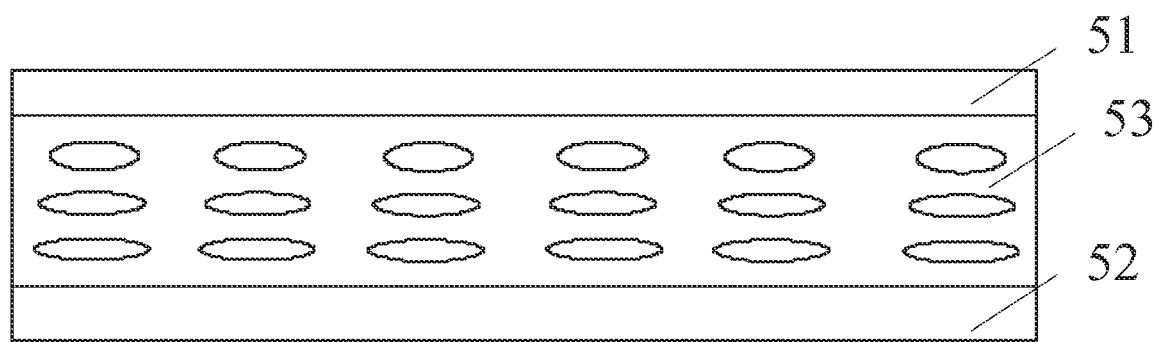
FIG. 5 is a schematic structural diagram of a display panel according to an embodiment of the application.

An embodiment of the application further provides a display panel. Referring to FIG. 5, a schematic structural diagram of a display panel is shown. Preferably, the display panel according to the embodiments of the application may be a liquid crystal display panel, including a color filter substrate 51, an array substrate 52 and a liquid crystal layer 53 formed between the color filter substrate 51 and the array substrate 52. The array substrate 52 may be any one of the above-mentioned array substrates according to the embodiments.

It should be noted that the display panel according to the embodiments of the application is not limited to the liquid crystal display panel and may also be an OLED display panel for example. The array substrate of the OLED display panel may be any one of the above-mentioned array substrates according to the embodiments. In addition, the display panel in an embodiment of the application may be any display panel including any one of the above-mentioned array substrates according to the embodiments.

An embodiment of the application further provides a display device. The display device may be a liquid crystal display device including a liquid crystal display panel and a backlight module which provides a light source for the liquid crystal display panel. The liquid crystal display panel is any one of the above-mentioned liquid crystal display panels according to the embodiments.

It should be noted that the display device according to an embodiment of the application is not limited to the liquid crystal display device and may also be an OLED display device. The display panel of the OLED display device may be any one of the above-mentioned OLED display panels according to the embodiments. In addition, the display device in the embodiments of the application may be any display device including any one of the above-mentioned display panels according to the embodiments.

In the array substrate, the display panel and the display device according to the embodiments of the application, the auxiliary electrode line segments are disposed between the display region and the first overlap region of the gate lines and the bus on the array substrate. The auxiliary electrode line segments cross the gate lines at the second overlap regions and are insulated from the gate lines and the bus. In addition, the auxiliary electrode line segments can be disposed in a same conductive layer as the bus or are disposed in a layer between a conductive layer where the bus is disposed and a conductive layer where the gate lines are disposed. Because of the auxiliary electrode line segments, the electrostatic discharge occurs between the gate lines and the auxiliary electrode line segments during the manufacture of the array substrate, to release the static electricity on the gate lines, thereby reducing to a great extent the probability of short circuit due to the electrostatic discharge between the gate lines and the bus and improving the product yield.

The description of the embodiments herein enables those skilled in the art to implement or use the disclosure. Numerous modifications to the embodiments are apparent to those skilled in the art, and the general principle herein may be implemented in other embodiments without deviation from the spirit or scope of the disclosure. Therefore, the disclosure is not limited to the embodiments described herein, but in accordance with the widest scope consistent with the principle and novel features disclosed herein.

What is claimed is:

1. An array substrate, comprising:
   a display region;
   a non-display region, wherein the non-display region surrounds the display region;
   a first overlap region;
   a plurality of second overlap regions;
   a plurality of gate lines in the display region;
   a bus electrically insulated from the gate lines in the non-display region;
   a gate drive circuit in the non-display region;
   wherein the gate lines extend into the non-display region and are electrically connected to the gate drive circuit, wherein each of the gate lines crosses the bus in the first overlap region;
   a plurality of auxiliary electrode line segments between the bus and the display region, wherein the auxiliary electrode line segments are electrically insulated from one another and from the gate lines, and wherein the auxiliary electrode line segments are disposed in either of:
      a) a same conductive layer as the bus, or
      b) a layer between the conductive layer of the bus and a conductive layer of the gate lines are disposed,
   wherein each of the gate lines crosses a different one of the auxiliary electrode line segments in a different one of the plurality of second overlap regions.

2. The array substrate according to claim 1, wherein the bus and the auxiliary electrode line segments are disposed in a same conductive layer.

3. The array substrate according to claim 2, wherein in a region where the auxiliary electrode line segments are disposed, the array substrate sequentially comprises along a direction of light transmission:
   a transparent substrate;
   the auxiliary electrode line segments on a surface of the transparent substrate;
   an insulating layer covering the auxiliary electrode line segments;
   the gate lines on the insulating layer; and
   a passivation layer covering a surface of the gate lines.

4. The array substrate according to claim 3, further comprising an amorphous silicon layer between the insulating layer and the gate lines, wherein the amorphous silicon layer is disposed on a surface of the insulating layer, and the gate lines are disposed on a surface of the amorphous silicon layer.

5. The array substrate according to claim 2, wherein in a region where the auxiliary electrode line segments are disposed, the array substrate sequentially comprises along a direction of light transmission:
   a transparent substrate;
   the gate lines disposed on a surface of the transparent substrate;
   an insulating layer covering a surface of the gate lines;
   the auxiliary electrode line segments on the insulating layer; and
   a passivation layer covering a surface of the auxiliary electrode line segments.

6. The array substrate according to claim 5, further comprising an amorphous silicon layer between the insulating layer and the auxiliary electrode line segments, wherein the amorphous silicon layer is disposed on a surface of the insulating layer, and the auxiliary electrode line segments are disposed on a surface of the amorphous silicon layer.

7. A display panel comprising an array substrate, the array substrate comprising:
   a display region;
   a non-display region, wherein the non-display region surrounds the display region;
   a first overlap region;
   a plurality of second overlap regions;
   a plurality of gate lines in the display region;
   a bus electrically insulated from the gate lines in the non-display region;
   a gate drive circuit in the non-display region;
   wherein the gate lines extend into the non-display region and are electrically connected to the gate drive circuit, wherein each of the gate lines crosses the bus in the first overlap region;
   a plurality of auxiliary electrode line segments between the bus and the display region, wherein the auxiliary electrode line segments are electrically insulated from one another and from the gate lines, and wherein the auxiliary electrode line segments are disposed in either of:
      a) a same conductive layer as the bus, or
      b) a layer between the conductive layer of the bus and a conductive layer of the gate lines are disposed,
   wherein each of the gate lines crosses a different one of the auxiliary electrode line segments in a different one of the plurality of second overlap regions.

8. The array substrate according to claim 7, wherein the bus and the auxiliary electrode line segments are disposed in a same conductive layer.

9. The array substrate according to claim 8, wherein in a region where the auxiliary electrode line segments are disposed, the array substrate sequentially comprises along a direction of light transmission:
- a transparent substrate;
- the auxiliary electrode line segments on a surface of the transparent substrate;
- an insulating layer covering the auxiliary electrode line segments;
- the gate lines on the insulating layer; and
- a passivation layer covering a surface of the gate lines.

10. The array substrate according to claim 9, further comprising an amorphous silicon layer between the insulating layer and the gate lines, wherein the amorphous silicon layer is disposed on a surface of the insulating layer, and the gate lines are disposed on a surface of the amorphous silicon layer.

11. The array substrate according to claim 8, wherein in a region where the auxiliary electrode line segments are disposed, the array substrate sequentially comprises along a direction of light transmission:
- a transparent substrate;
- the gate lines disposed on a surface of the transparent substrate;
- an insulating layer covering a surface of the gate lines;
- the auxiliary electrode line segments on the insulating layer; and
- a passivation layer covering a surface of the auxiliary electrode line segments.

12. The array substrate according to claim 11, further comprising an amorphous silicon layer between the insulating layer and the auxiliary electrode line segments, wherein the amorphous silicon layer is disposed on a surface of the insulating layer, and the auxiliary electrode line segments are disposed on a surface of the amorphous silicon layer.

13. A display device comprising a display panel, the display panel comprising an array substrate, and the array substrate comprising:
- a display region;
- a non-display region, wherein the non-display region surrounds the display region;
- a first overlap region;
- a plurality of second overlap regions;
- a plurality of gate lines in the display region;
- a bus electrically insulated from the gate lines in the non-display region;
- a gate drive circuit in the non-display region;
- wherein the gate lines extend into the non-display region and are electrically connected to the gate drive circuit, wherein each of the gate lines crosses the bus in the first overlap region;
- a plurality of auxiliary electrode line segments between the bus and the display region, wherein the auxiliary electrode line segments are electrically insulated from one another and from the gate lines, and wherein the auxiliary electrode line segments are disposed in either of:
  a) a same conductive layer as the bus, or
  b) a layer between the conductive layer of the bus and a conductive layer of the gate lines are disposed,
- wherein each of the gate lines crosses a different one of the auxiliary electrode line segments in a different one of the plurality of second overlap regions.

14. The array substrate according to claim 13, wherein the bus and the auxiliary electrode line segments are disposed in a same conductive layer.

* * * * *